United States Patent
Lin

(10) Patent No.: US 6,819,915 B2
(45) Date of Patent: Nov. 16, 2004

(54) APPLICATIONS OF A DIFFERENTIAL LATCH

(75) Inventor: Tsung-Hsien Lin, Los Angeles, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/728,201

(22) Filed: Dec. 4, 2003

(65) Prior Publication Data

US 2004/0080345 A1 Apr. 29, 2004

Related U.S. Application Data

(62) Division of application No. 10/201,152, filed on Jul. 23, 2002, now Pat. No. 6,693,476.

(51) Int. Cl.[7] ................................................. H04B 1/38
(52) U.S. Cl. ....................... 455/403; 455/458; 455/450; 455/560; 375/216; 375/344
(58) Field of Search ................................. 455/403, 458, 455/560, 557, 412.1, 465, 462, 450, 502, 426.1; 375/216, 344, 316, 329; 326/93–98; 327/203, 208, 212, 210, 211

(56) References Cited

U.S. PATENT DOCUMENTS

| | | | | |
|---|---|---|---|---|
| 5,991,344 A | * | 11/1999 | Fujii et al. .................. | 375/344 |
| 5,995,844 A | * | 11/1999 | Fukuda ........................ | 455/462 |
| 6,295,461 B1 | * | 9/2001 | Palmer et al. .............. | 455/557 |
| 6,756,821 B2 | * | 6/2004 | Lin ............................. | 326/115 |

* cited by examiner

*Primary Examiner*—Vibol Tan
(74) *Attorney, Agent, or Firm*—Timothy W. Markison

(57) ABSTRACT

A differential latch includes a sample transistor section, a hold transistor section, a $1^{st}$ gating circuit and a $2^{nd}$ gating circuit. The sample transistor section is operably coupled to sample, when coupled to a supply voltage (e.g., $V_{DD}$ and $V_{SS}$) a differential input signal. The hold transistor section is operably coupled to latch, when coupled to the supply voltage, the sampled differential input to produce a latched differential signal. The $1^{st}$ gating circuit is operable to couple the sampled transistor section to the supply voltage in accordance with a $1^{st}$ clocking logic operation and a $2^{nd}$ clocking logic operation. The $2^{nd}$ gating circuit is operable to couple the hold transistor section to the supply voltage in accordance with a $3^{rd}$ clocking logic operation and a $4^{th}$ clocking logic operation.

26 Claims, 8 Drawing Sheets

FIG. 3 local oscillation module 74

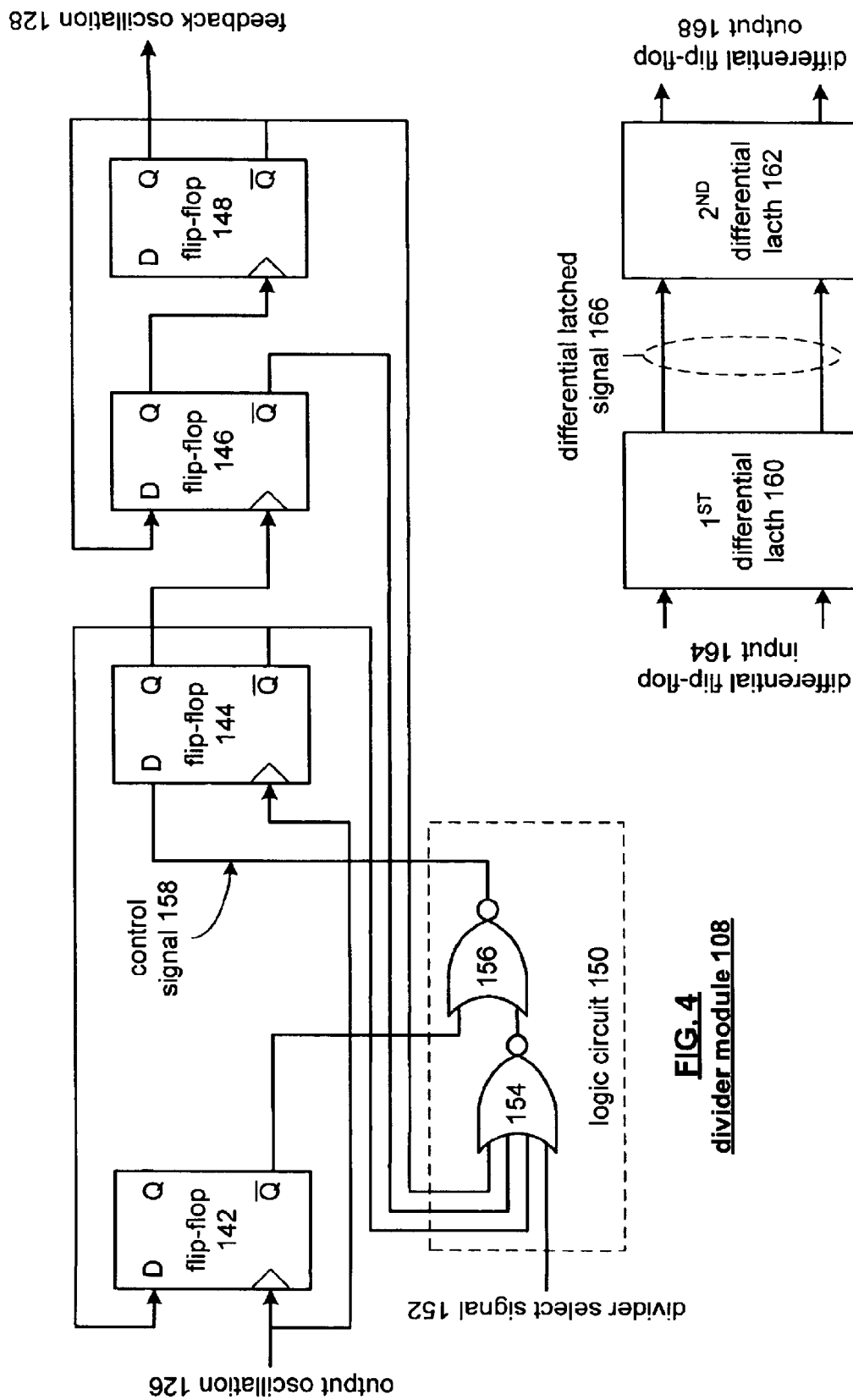
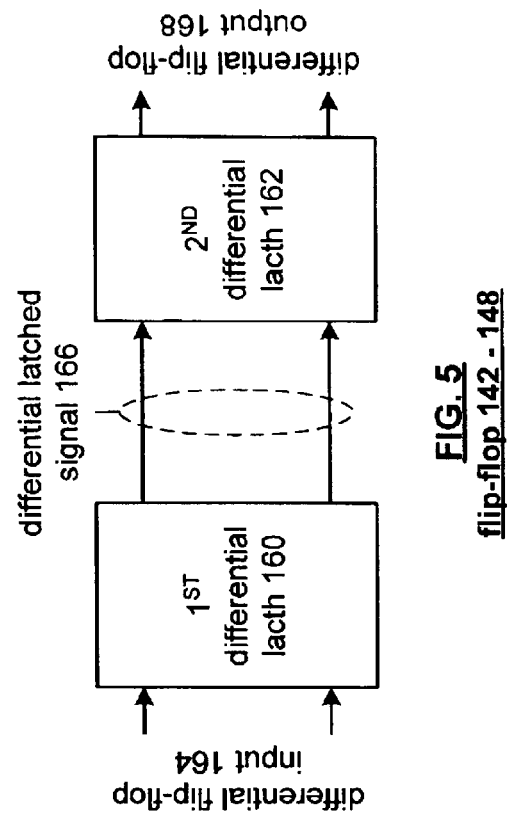
FIG. 4
divider module 108
FIG. 5
flip-flop 142 - 148 differential latch 160 or 162

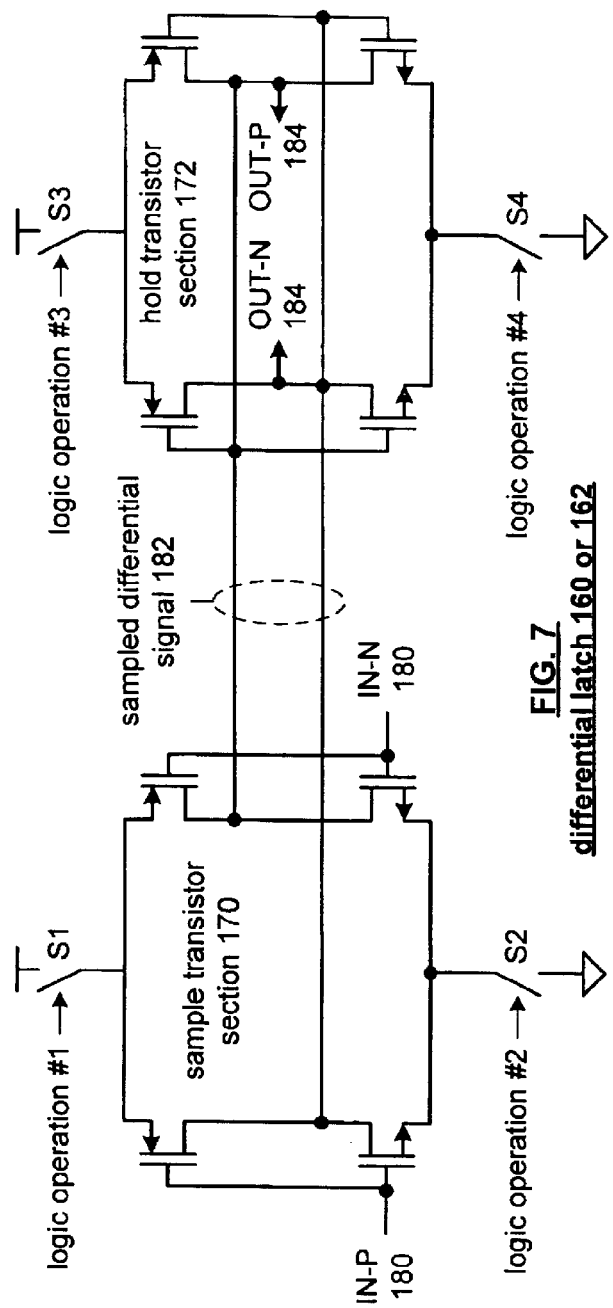
FIG. 7 differential latch 160 or 162
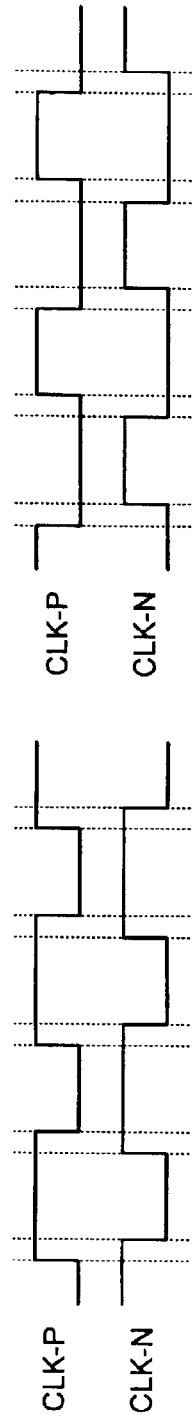
FIG. 8 overlapping clocks
FIG. 9 non-overlapping clocks
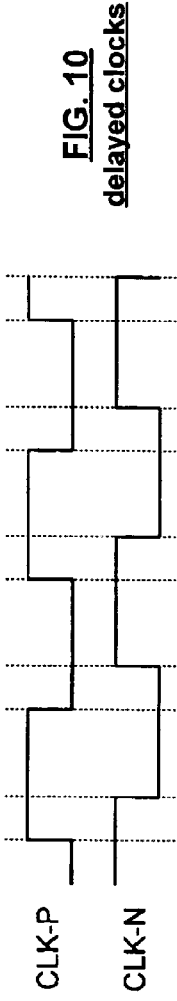
FIG. 10 delayed clocks

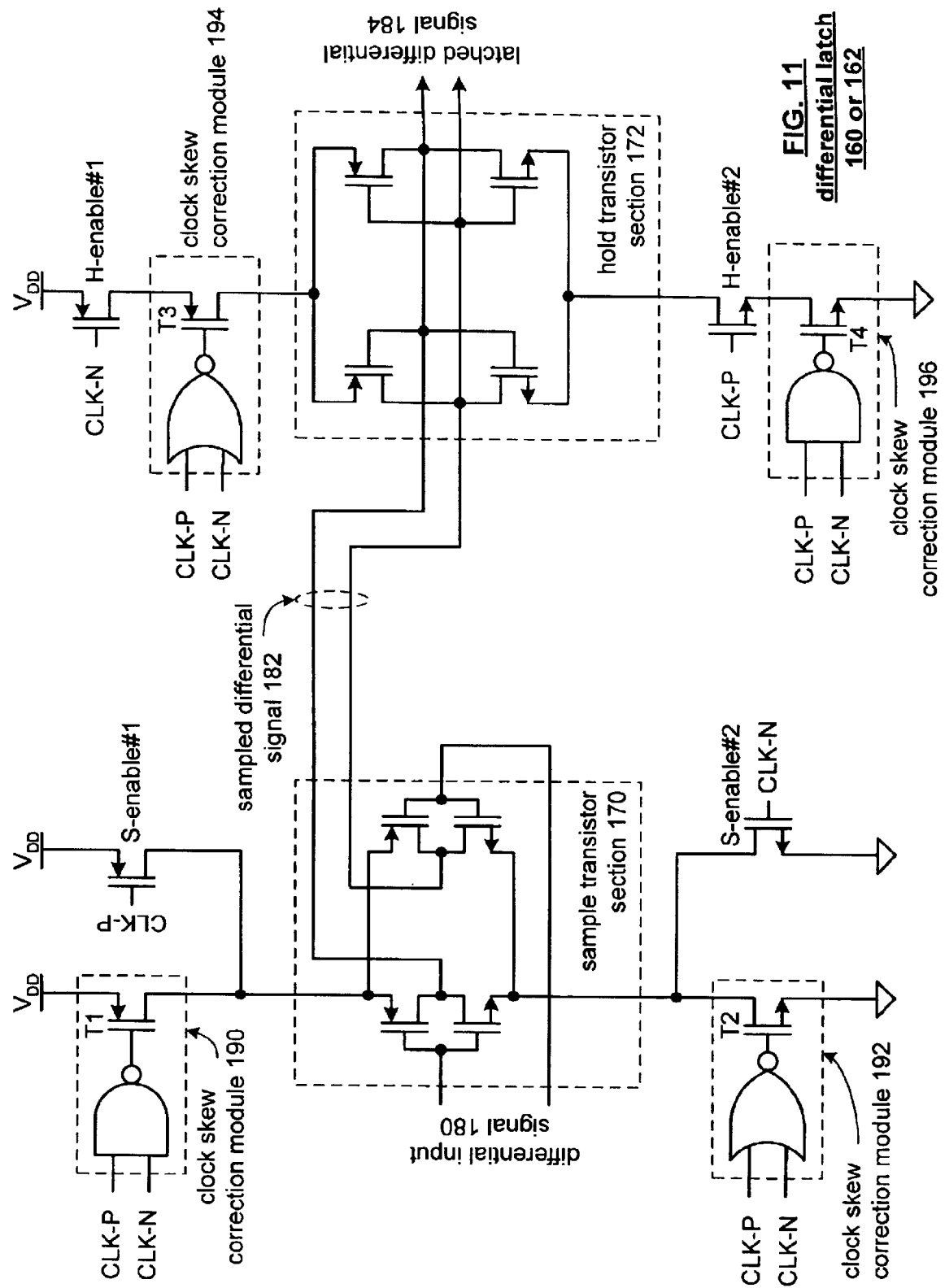
FIG. 11 differential latch 160 or 162

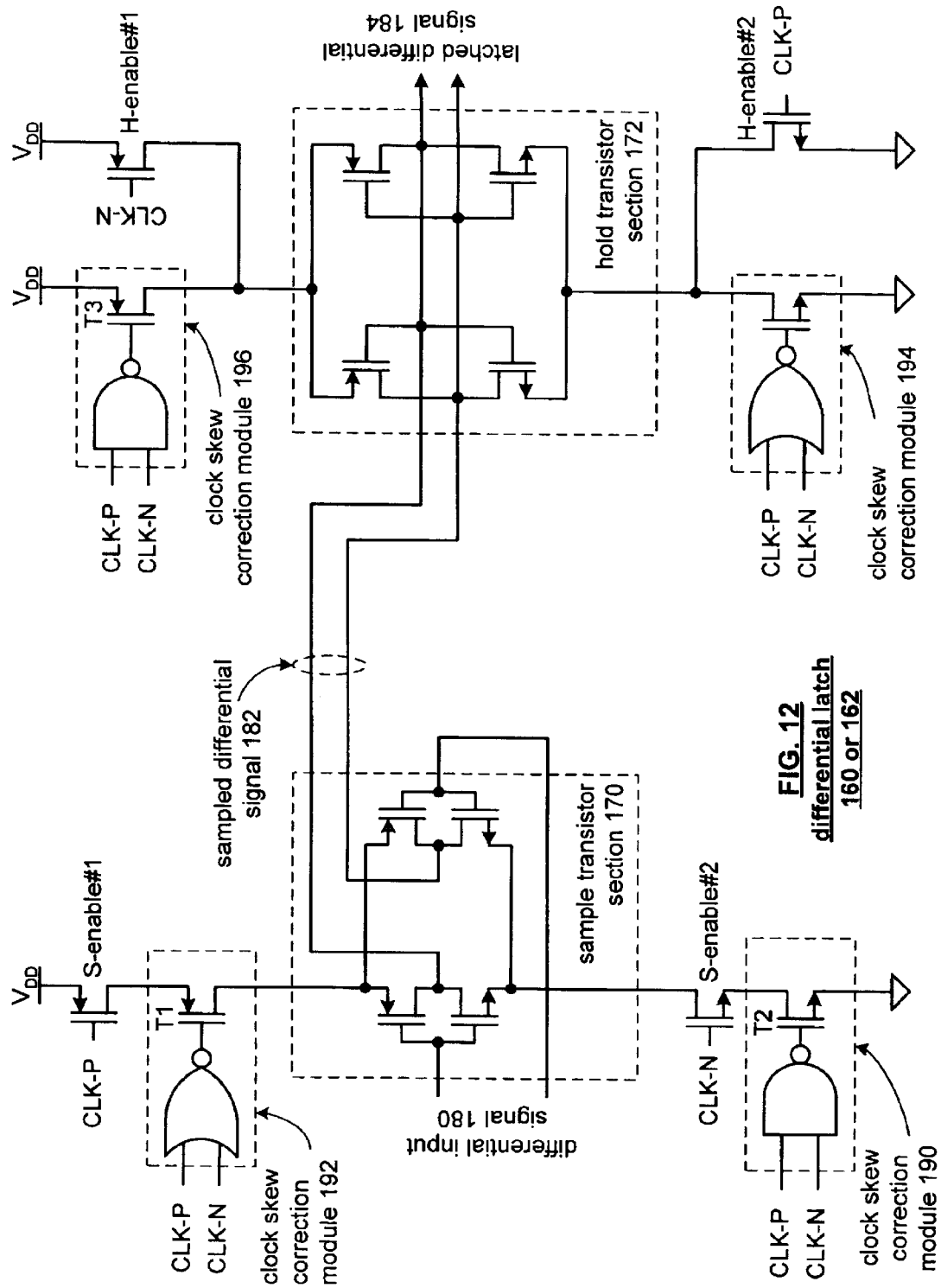

ature equipment, telecommunication infrastructure
APPLICATIONS OF A DIFFERENTIAL LATCH This patent application is a divisional and claiming priority under 35 USC § 121 to patent application entitled A DIFFERENTIAL LATCH AND APPLICATIONS THEREOF having a Ser. No. 10/201,152 and a filing date of Jul. 23, 2002 which is now a U.S. Pat. No. 6,693,476.

BACKGROUND OF THE INVENTION

1. Technical Field of the Invention

This invention relates generally to digital circuitry and more in particular to differential digital circuitry.

2. Description of Related Art

Digital logic circuits, such as AND gates, NAND gates, NOR gates, OR gates, exclusive OR gates, latches, inverters, flip-flops, et cetera, are known to be used in a wide variety of electronic devices. For instance, digital logic circuits are used in all types of computers (e.g., laptops, personal computers, personal digital assistants, Internet, infrastructure equipment, telecommunication infrastructure equipment, et cetera), entertainment equipment (e.g., receivers, televisions, et cetera), and wireless communication devices (e.g., cellular telephones, radios, wireless local area networks, et cetera).

Typically, digital logic circuits are part of a larger circuit, which is fabricated as an integrated circuit. For example, a local oscillator within a radio frequency transmitter and/or receiver includes a plurality of flip-flops in its divider feedback section to provide adjustable divider values. As is known, by adjusting the divider value in a local oscillator, the resulting local oscillation can be adjusted to desired values.

As is also known, high performance applications, such as a radio frequency transmitter/receiver integrated circuit (IC), use differential signaling throughout the signal path to improve noise immunity. Accordingly, the circuits processing the differential signaling are differential circuits. For digital differential circuits, including digital logic circuits, a differential clock is needed to produce a 2-phase clock signal. Ideally, the two phases of the clock are complimentary (i.e., the inverse of each other) such that digital differential circuits produce complimentary output data. In practice, however, an ideal differential clock that has perfect complimentary phases is impossible to achieve due to component mismatches, IC process variations, et cetera, which result in rise and fall time mismatches of the 2 phases.

In lower rate applications, these mismatches are negligible and digital differential circuits clocked thereby operate sufficiently well. However, as the operating rates increase to the limits of integrated circuit fabrication processes (e.g., CMOS, gallium arsenide, silicon germanium), the mismatches are no longer negligible and, as such, digital differential circuits produce non-complimentary differential outputs, which leads to erroneous output values. Such errors are exasperated when the digital differential circuits are cascaded together, when the differential clock is passed through several inverter stages, or when the differential clock drives large loads.

Therefore, a need exists for a digital differential circuit for use in a high performance application, such as a radio frequency integrated circuit, that is insensitive to non-complimentary differential clocks and produces accurate complimentary digital outputs.

BRIEF SUMMARY OF THE INVENTION

The differential latch and applications thereof substantially meet these needs and others. In one embodiment of a differential latch, it includes a sample transistor section, a hold transistor section, a $1^{st}$ gating circuit and a $2^{nd}$ gating circuit. The sample transistor section is operably coupled to sample, when coupled to a supply voltage (e.g., $V_{DD}$ and $V_{SS}$) a differential input signal. The hold transistor section is operably coupled to latch, when coupled to the supply voltage, the sampled differential input to produce a latched differential signal.

The $1^{st}$ gating circuit is operable to couple the sampled transistor section to the supply voltage in accordance with a $1^{st}$ clocking logic operation and a $2^{nd}$ clocking logic operation. The $1^{st}$ and $2^{nd}$ clocking logic operations insure that the sample transistor section is coupled to $V_{DD}$ and $V_{SS}$ at substantially the same time regardless of skewing of the differential clock signal (i.e., the clock phases being non-complimentary). The $2^{nd}$ gating circuit is operable to couple the hold transistor section to the supply voltage in accordance with a $3^{rd}$ clocking logic operation and a $4^{th}$ clocking logic operation. The $3^{rd}$ and $4^{th}$ clocking logic operations ensure that the hold transistor section is coupled to $V_{DD}$ and $V_{SS}$ at substantially the same time regardless of clock skewing. As such, by utilizing the $1^{st}$ and $2^{nd}$ gating circuits to trigger the sampling and holding of a differential latch, an accurate differential latch is achieved even though it is being triggered by a non-complimentary differential clock.

A flip-flop may be achieved by using a pair of differential latches coupled in series. Each of the differential latches includes the sample transistor section, the hold transistor section, the $1^{st}$ gating circuit and the $2^{nd}$ gating circuit. A plurality of such flip-flops may be used in a divider section of a local oscillator to provide various divider values. Further, such a local oscillator, or oscillation synthesizer, may be used in a radio frequency integrated circuit. By utilizing such a differential latch in a flip-flop, local oscillator and/or radio frequency integrated circuit, the performance of such devices is improved since the differential latch is insensitive to non-complimentary phases of a differential clock.

BRIEF DESCRIPTION OF THE SEVERAL VIEWS OF THE DRAWINGS

FIG. 4 is a schematic block diagram of a divider module that may be used in the local oscillation module of FIG. 3;

FIG. 5 is a schematic block diagram of a flip-flop in accordance with the present invention;

FIG. 7 is a schematic block diagram of an alternate differential latch in accordance with the present invention;

FIGS. 8–10 are graphical representations of various differential clock skewing waveforms that are overcome by the differential latch in accordance with the present invention;

FIG. 11 is a schematic block diagram of another differential latch in accordance with the present invention; and FIG. 12 is a schematic block diagram of yet another differential latch in accordance with the present invention.

DETAILED DESCRIPTION OF THE INVENTION

Figure 1:
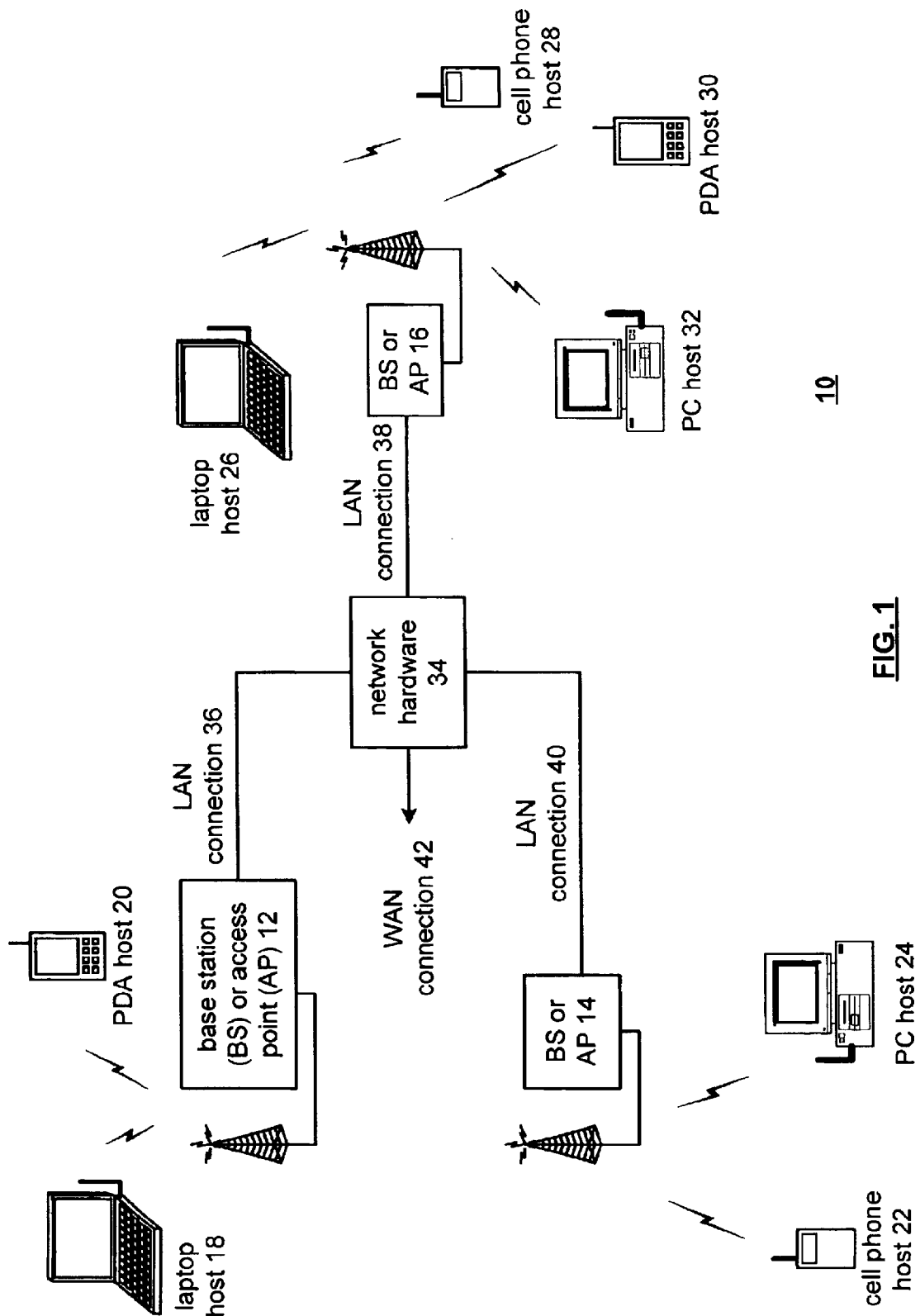
FIG. 1 is a schematic block diagram of a wireless communication system that is in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
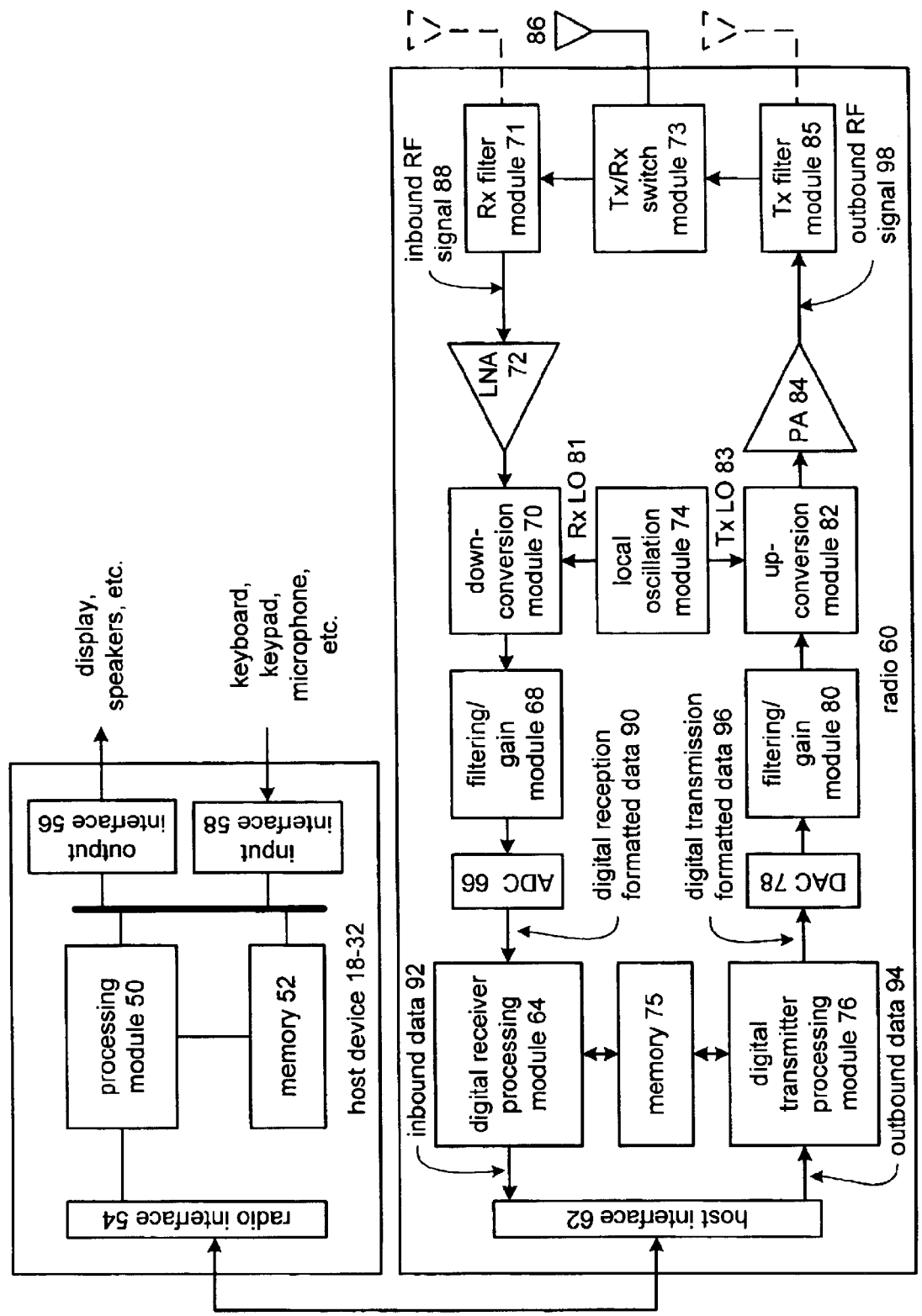
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
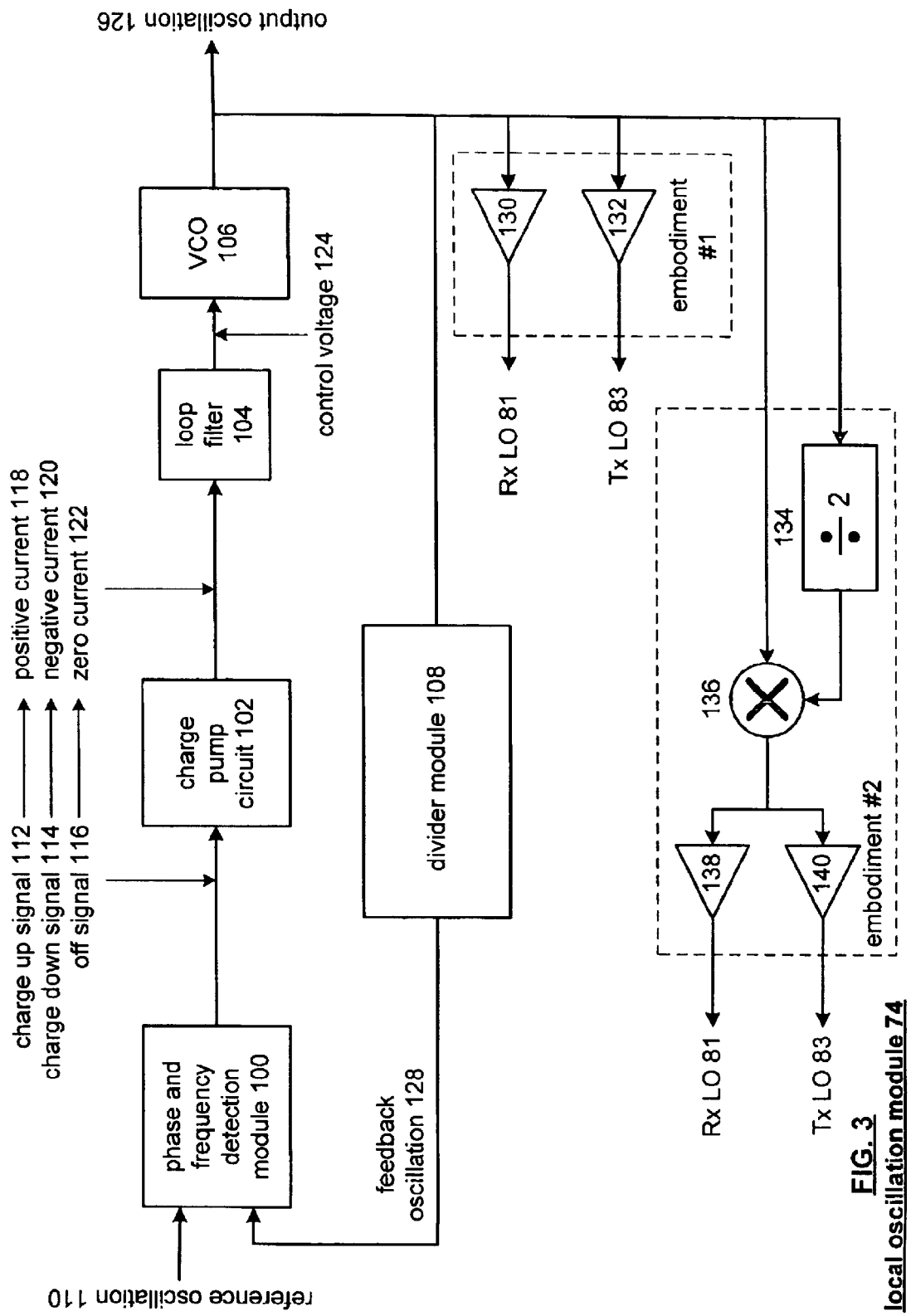
FIG. 3 is a schematic block diagram of a local oscillation module that may be used in the wireless communication device of FIG. 2.

FIG. 3 illustrates an embodiment of the local oscillation module 74 that includes a phase and frequency detection module 100, a charge pump circuit 102, a loop filter 104, a voltage controlled oscillator (VCO) 106, and a divider module 108. The receiver local oscillation 81 and the transmitter local oscillation 83 may be generated from the output oscillation 126 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increase oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. A crystal oscillator and/or any other type of clock source may produce the reference oscillation 110. The phase and frequency detection module 100 produces a charge-up signal 112 when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal 114 when the phase and/or frequency of the feedback oscillation 128 leads the phase and/or frequency of the reference oscillation 110. In this condition, the output oscillation 126 is above its desired rate. The phase and frequency detection module 100 produces the off signal 116 when the phase and/or frequency of the feedback oscillation 128 is aligned with the phase and/or frequency of the reference oscillation 110 and when the charge up signal 112 and charge down signal 114 are not being produced.

The charge pump circuit 102 receives the charge-up signal 112, the charge-down signal 114 and the off signal 116. The charge pump 102 produces a positive current 118 in response to the charge-up signal 112; produces a negative current 120 in response to the charge-down signal 114; and produces a zero current 122 in response to the off signal 116. The loop filter 104 receives the positive current 118, negative current 120 and the zero current 122 and produces therefrom a control voltage 124. The loop filter 104 provides the control voltage 124 to the voltage control oscillator 106, which generates the output oscillation 126 based thereon.

The divider module 108, which may be a fractional-N divider module, divides the output oscillation 126 by a divider value (e.g., an integer value or a real number) to produce the feedback oscillation 128. The divider module 108 will be described in greater detail with reference to FIG. 4. Note that if the divider module 108 is a fractional-N divider module it includes a Delta Sigma modulator, register and summing module. The Delta Sigma modulator is operably coupled to generate an over sampled digital data stream that represents a fractional component of the fractional-N divider value. The register stores an integer component of the fractional-N divider value while the summing module sums the over sampled digital data stream with the integer component to produce the fractional-N divider value.

FIG. 4 illustrates a schematic block diagram of divider module 108. The divider module 108 includes a plurality of flip-flops 142–148 and logic circuitry 150, which process differential signals or single-ended signals. The logic circuit 150 includes NOR gate 154 and NOR gate 156. The logic circuitry 150 produces a control signal 158 based on the outputs of the flip-flops 142, 144, 146 and 148 as well as a divider select signal 152. In accordance with the control signal 158, the divider module 108 will provide a divide by 15 function or divide by 16 function. Accordingly, the feedback oscillation 128 will be $1/15^{th}$ or $1/16^{th}$ the output oscillation 126.

FIG. 5 is a schematic block diagram of flip-flops 142–148. The flip-flops include a $1^{st}$ differential latch 160 and a $2^{nd}$ differential latch 162. The 1st differential latch 160 receives a differential flip-flop input 164 and produces therefrom a differential latched signal 166. The 2nd differential latch 162 receives the differential latch signal 166 and produces therefrom the differential flip-flop output 168. The details of the differential latch 160 and 162 will be described in greater detail with reference to FIGS. 6–12.

As one of average skill in the art will appreciate, the flip-flop illustrated in FIG. 5 may be utilized in any type of circuit requiring the use of a flip-flop. The flip-flop illustrated in FIG. 5 may also be implemented as a JK flip-flop, D flip-flop, and/or any other type of flip-flop.

Figure 6:
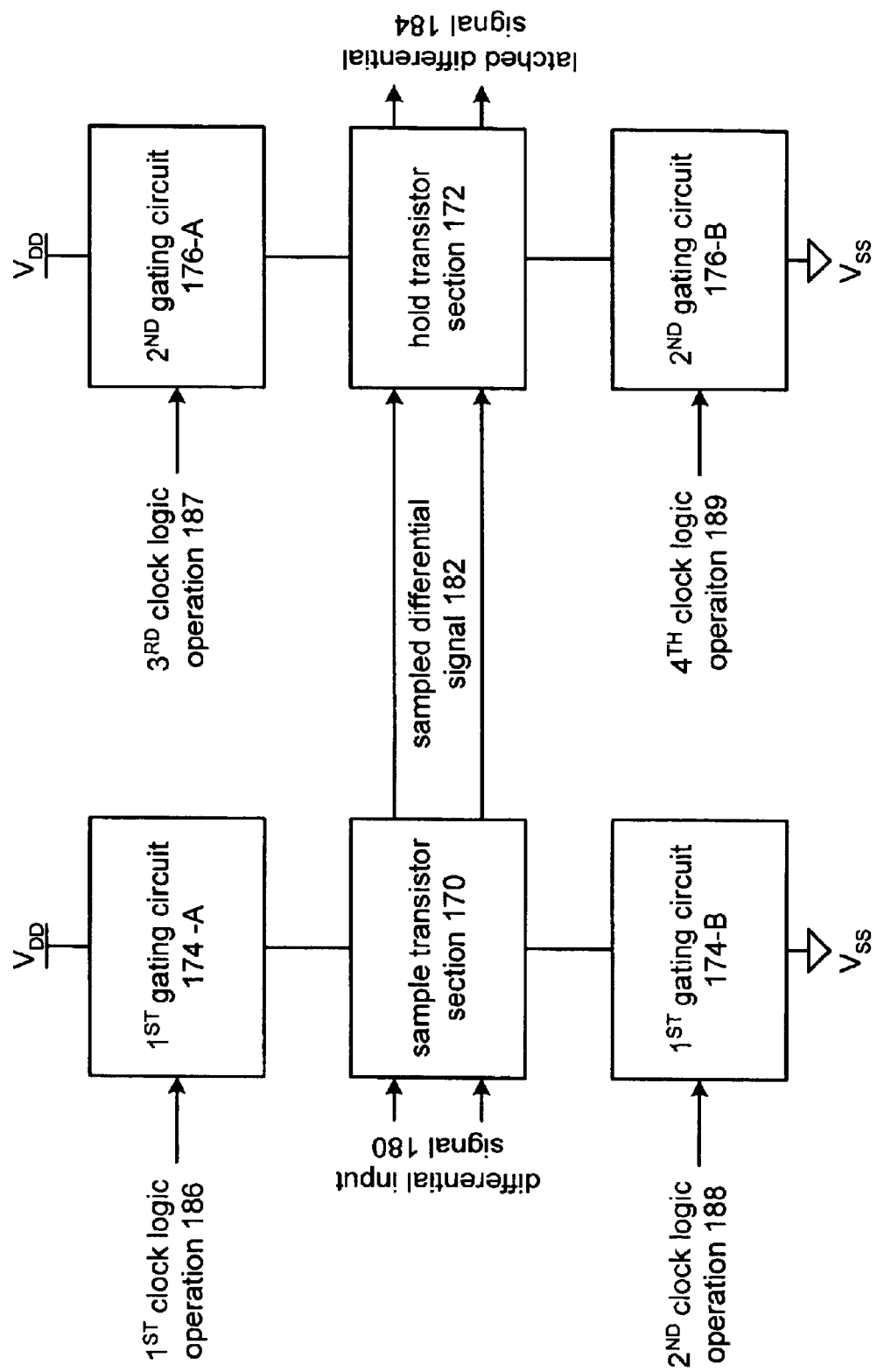
FIG. 6 is a schematic block diagram of a differential latch in accordance with the present invention.

FIG. 6 is a schematic block diagram of differential latch 160 and/or 162. As shown, the differential latch includes a sample transistor section 170, a hold transistor section 172, a 1st gating circuit 174, which has two parts A and B, and a 2nd gating circuit 176, which also has two parts A and B. The sample transistor section 170 is operably coupled to receive a differential input signal 180. For instance, the differential input signal 180 may correspond to the differential flip-flop input 164 of FIG. 5 if the differential latch is the 1st differential latch 160 or may correspond to the differential latch signal 166 if the differential latch is the 2nd differential latch 162.

Returning to the discussion of FIG. 6, the sample transistor section 170, when coupled to the supply voltage ($V_{DD}$ to $V_{SS}$) via the 1st gating circuit 174, samples the differential input signal 180 and produces a sampled differential signal 182. The 1st gating circuit 174 couples the sample transistor section 170 to the supply voltage based on a 1st clock logic operation 186 and a 2nd clock logic operation 188. The 1st and 2nd clock logic operations 186 and 188 are implemented to overcome clock skewing of a differential clock. Clock skewing may correspond to an overlapping clock, non-overlapping clock or delayed clocks between the phases as illustrated in FIGS. 8–10, which will be discussed subsequently. Accordingly, the 1st gating circuit, via section 174A, couples the sample transistor section 170 to $V_{DD}$ at substantially the same time that the 1st gating circuit, via section 174B, couples the sample transistor section to $V_{SS}$. In this manner, the sample transistor section 170 samples both phases of the differential input signal 180 at substantially the same time with reference to both $V_{DD}$ and $V_{SS}$, thus insuring that the sampled differential signal 182 is accurate and that both phases of the differential output signal are substantially complimentary.

The hold transistor section 172 holds, or latches, the sampled differential signal 182 to produce a latch differential signal 184, which may be the differential latch signal 166 or the differential flip-flop output 168. The hold transistor section 172 latches the sampled differential signal 182 when coupled to the supply voltage ($V_{DD}$ and $V_{SS}$) via the 2nd gating circuit, via sections 176A and B. The 2nd gating circuit, via sections 176A and B, couples the hold transistor section 172 to $V_{DD}$ and $V_{SS}$ based on a 3rd clock logic operation 187 and a 4th clock logic operation 189. The 3rd and 4th clock logic operations 187 and 189 are implemented to overcome clock skewing of the differential clock.

FIG. 7 illustrates a schematic block diagram of an alternate embodiment of differential latch 160 or 162. The differential latch includes sample transistor section 170, hold transistor section 172, and switches S1–S4. The sample transistor section 170 includes a 1st inverting transistor pair operably coupled to produce one leg of the sampled differential input signal and a 2nd inverting transistor pair operably coupled to produce another leg of the sampled differential input signal. The hold transistor section 172 includes a 1st inverting transistor pair operably coupled to produce one leg of the last differential signal 184 from one leg of the sampled differential input signal and a 2nd inverting transistor pair operably coupled to produce another leg of the latched differential signal 184 from another leg of the sampled differential input signal.

The sample transistor section 170 is operably coupled to the supply voltage ($V_{DD}$ and $V_{SS}$) based on logic operation number 1 and logic operation number 2. Similarly, the hold transistor section 172 is coupled to the supply voltage via logic operations number 3 and logic operation number 4. The functionality of the logic operations 1–4 are implemented to ensure that the corresponding switches (e.g., switch 1 and 2 for sample transistor section 170 and switch 3 and 4 for hold transistor section 172) are enabled simultaneously. In addition, it may be desirable to disable the pair of switches simultaneously.

The general concept of logic functions 1–4 may be illustrated with respect to FIGS. 8–10. FIG. 8 illustrates a differential clock that is skewed to have overlapping clocks. As shown, both the positive leg and negative leg of the differential clock are high (logic state 1) at the same time. In this instance, logic operations 1, 2, 3 and 4 are implemented such that when both the phases of the differential clock are high, the switches are either closed or open. As such, when the clocks are in the same state, the pair of switches may either be on or off.

FIG. 9 illustrates a differential clock that is skewed to have non-overlapping clocks. As shown, the positive phase of the differential clock and negative phase of the differential clock are both low (i.e., logic state 0) at the same time. During these states, the logic operations 1–4 ensure that the pair of switches are either both on or both off. This ensures that regardless of the clock skewing, the sample transistor section 170 and hold transistor section 172 will produce complimentary output signals.

FIG. 10 illustrates a differential clock that has the phases delayed with respect to one another. As shown, the positive leg of the differential clock leads the negative leg of the differential clock. In these instances, the logic operations 1–4 are implemented to ensure that the switching pairs S1, S2, S3 and S4 are either both on or both off during the time period when the clocks are in the same state. As one of average skill in the art will appreciate, the clock skewing as illustrated in FIGS. 8–10 may be the result of IC manufacturing variations of implementing transistors, different operations of P-channel transistors and N-channel transistors at very high rates, which push the operating limits of an integrated circuit process.

FIG. 11 illustrates another embodiment of a differential latch 160 or 162. The differential latch includes the sample transistor section 170, the hold transistor section 172, the 1st gating circuit 174 and the 2nd gating circuit 176. The 1st gating circuit includes transistors S-enable 1 and S-enable 2 and clock skew correction modules 190 and 192. The 2nd gating circuit 176 includes an H-enable transistor 1 and an H-enable transistor 2 and clock skew correction modules 194 and 196. In this example, clock skew correction module 190 in combination with the S-enable 1 transistor performs the 1st logic operation of FIG. 7, the S-enable 2 transistor in combination with the clock skew correction module 192 performs the 2nd logic operation, the H-enable 1 transistor in combination with the clock skew correction module 194 performs the 3rd logic operation, and the H-enable 2 transistor in combination with the clock skew correction module 196 performs the 4th logic operation.

The sample transistor section 170 is enabled at the rising edge of the negative leg of the differential clock and the falling edge of the positive leg to sample the differential input signal 180. Thus, with reference to FIG. 8, the clock skew correction module 190 turns on transistor T1 when both the positive and negative phases of the differential clock are high. With the sampling occurring at the rising edge of the negative clock and the falling edge of the positive leg of the clock occurring some time later, the S-enable transistor is off until the positive leg transitions low. However, with transistor T1 being activated within the clock skew correction module 190, and S-enable 2 transistor being activated via the negative phase of the differential clock, the sample transistor section 170 is simultaneously coupled to the supply voltage $V_{DD}$ and $V_{SS}$ with the overlapping clock skewing as illustrated in FIG. 8.

When the clock is skewed as illustrated in FIG. 9, the trailing edge of the positive leg of the differential clock transitions low before the rising edge of the negative leg of the differential clock. To overcome this skewing, the clock skew correction module 192 activates transistor T2 when both phases of the differential clock are low. In this instance, transistor T2 and the S-enable 1 transistor, which transitions on the falling edge of the positive phase of the clock, are activated at substantially the same time thereby coupling the sample transistor section 170 to $V_{DD}$ and $V_{SS}$ at substantially the same time.

The clock skew correction module 194 enables transistor T3 whenever one or both of the clock phases is high. When both clock phases are low, transistor T3 is off. The clock skew correction module 196 enables transistor T4 whenever one or both of the phases of the clock is low. When both phases are high, transistor T4 is disabled. The hold transistor section 172 is activated on the trailing edge of the negative clock and rising edge of the positive clock.

With reference to FIG. 8, when the clock is skewed to include overlapping clock phases, the H-enable 1 transistor is activated when the negative leg of the differential clock transitions low. Transistor T3 is on unless both the phases of the negative and positive leg are zero. Transistor T4 is enabled whenever one or both of the phases is zero. When both phases are high, T4 is off. Accordingly, when overlap exists, T4 remains off when both the positive and negative phases are high. When the negative phase transitions low, T4 is activated and H-enable 2 transistor is activated when the positive phase is high. As such, the hold transistor section 172 is simultaneously coupled to $V_{DD}$ and $V_{SS}$ at the trailing edge of the negative phase of the differential clock.

When the clock is skewed as illustrated in FIG. 9, the clock skew correction module 194 keeps transistor T3 off when both the positive and negative phases of the differential clock are low. As such, the clock skew correction module 194 aligns the coupling of the hold transistor section 172 to the supply voltage until the rising edge of the positive phase of the differential clock occurs.

As one of average skill in the art will appreciate, the NOR gates of clock skew correction module 192 and clock skew correction module 194 may be shared as well as the NAND gates of clock skew correction modules 190 and 196.

FIG. 12 illustrates another embodiment of differential latch circuit 160 or 162. This embodiment includes the sample transistor section 170, the hold transistor section 172, the $1^{st}$ gating circuit 174 and the $2^{nd}$ gating circuit 176. The $1^{st}$ gating circuit 174 includes clock skew correction module 192, S-enable 1 transistor, clock skew correction module 190 and S-enable 2 transistor. The $2^{nd}$ gating circuit 176 includes clock skew correction module 196, H-enable 1 transistor, clock skew correction module 194, and H-enable 2 transistor. In this embodiment, the clock skew correction module 192 compensates for clock skewing when the clock includes non-overlapping clocks as illustrated in FIG. 9. The clock skew correction module 190 compensates for when the clock skewing includes overlapping clocks as shown in FIG. 8. As one of average skill in the art will appreciate, the clock skew correction modules 190 and 192 will also compensate for skewing that results from delayed clocks as illustrated in FIG. 10.

Clock skew correction module 196, compensates for clock skewing that results when the clock skewing includes overlapping clocks as shown in FIG. 8. The clock skew correction module 194 compensates for when the clock skewing includes non-overlapping clocks as illustrated in FIG. 9. As one of average skill in the art will appreciate, clock skewing modules 196 and 194 further compensate for clock skewing that includes delayed clocks as illustrated in FIG. 10. As one of average skill in the art will also appreciate, the NOR gates in clock skew correction module 192 and clock skew correction module 194 may be shared. In addition, the NAND gates in clock skew correction modules 190 and 196 may also be shared.

The preceding discussion has presented a differential latch that is insensitive to differential clock skewing that may include overlapping clock phases, non-overlapping clock phases, and/or delayed clock phases. As such, the differential latch of the present invention provides accurate and complimentary differential outputs. As one of average skill in the art will appreciate, the polarity of the differential clock signal in FIGS. 11 and 12 may be reversed such that S-enable #1 transistor and H-enable #2 transistor are enabled based on the negative leg of the differential clock and the S-enable #2 transistor and H-enable #1 transistor are enabled based on the positive leg of the differential clock. As one of average skill in the art will further appreciate, other embodiments may be derived from the teachings of the present invention, without deviating from the scope of the claims.

What is claimed is:

1. An oscillation synthesizer comprises:
   phase and frequency detector operably coupled to generate a charge up signal when phase of a reference oscillation leads phase of a feedback oscillation or when frequency of the reference oscillation leads frequency of the feedback oscillation, to generate a charge down signal when the phase of the reference oscillation lags the phase of the feedback oscillation or when the frequency of the reference oscillation lags the frequency of the feedback oscillation;
   charge pump operably coupled to produce a positive current in response to the charge up signal and to produce a negative current in response to the charge down signal;
   loop filter operably coupled to generate a control voltage based on the positive current and negative current;
   voltage controlled oscillator operably coupled to generate an output oscillation based on the control voltage; and
   divider module operably coupled to produce the feedback oscillation from the output oscillation based on a divider value, wherein the divider module includes:
   plurality of flip-flops interoperably coupled to produce the divider value based on a control signal; and
   logic circuit operably coupled to produce the control signal based on divider select signals, wherein each of the plurality of flip-flops includes:

first differential latch module operably coupled to
produce a differential latched signal based on a
differential flip-flop input signal; and
second differential latch module operably coupled to
produce a differential flip-flop output based on the
differential latched signal, wherein the first and
second differential latch modules each includes:
sample transistor section operably coupled to
sample, when coupled to a supply voltage, a
differential input signal to produce a sampled
differential input signal;
hold transistor section operably coupled to latch,
when coupled to the supply voltage, the
sampled differential input signal thereby producing a latched differential signal;
first gating circuit operable to couple the sample
transistor section to the supply voltage in
accordance with a first clocking logic operation and a second clocking logic operation,
wherein the first clocking logic operation is
based on a negative leg and a positive leg of a
differential clock signal, and wherein the second clocking logic operation is based on the
negative leg and the positive leg of the differential clock signal; and
second gating circuit operable to couple the hold
transistor section to the supply voltage in
accordance with a third clocking logic operation and a fourth clocking logic operation,
wherein the third clocking logic operation is
based on the negative leg and the positive leg
of the differential clock signal, and wherein the
fourth clocking logic operation is based on the
negative leg and the positive leg of the differential clock signal.

2. The oscillation synthesizer of claim 1, wherein the first gating circuit further comprises:
first enable transistor operable to couple the sample
transistor section to a first potential of the supply
voltage based on the positive leg of the differential
clock signal;
second enable transistor operable to couple the sample
transistor section to a second potential of the supply
voltage based on the negative leg of the differential
clock signal;
first clock skew correction module operably coupled in
parallel with the first enable transistor, wherein the first
clock skew correction module couples the sample transistor section to the first potential based on a first logic
function of the positive and negative legs of the differential clock signal; and
second clock skew correction module operably coupled in
parallel with the second enable transistor, wherein the
second clock skew correction module couples the
sample transistor section to the second potential based
on a second logic function of the positive and negative
legs of the differential clock signal.

3. The oscillation synthesizer of claim 2, wherein the first clock skew correction module further comprises:
a P-channel transistor having a gate, a drain, and a source,
wherein the source is coupled to the first potential, the
drain is coupled to the sample transistor section, and the
gate is coupled to receive a first clock skew correction
signal; and
NAND gate operably coupled to produce the first clock
skew correction signal based on the negative and
positive legs of the differential clock signal.

4. The oscillation synthesizer of claim 2, wherein the second clock skew correction module further comprises:
an N-channel transistor having a gate, a drain, and a
source, wherein the source is coupled to the second
potential, the drain is coupled to the sample transistor
section, and the gate is coupled to receive a second
clock skew correction signal; and
NOR gate operably coupled to produce the second clock
skew correction signal based on the negative and
positive legs of the differential clock signal.

5. The oscillation synthesizer of claim 1, wherein the second gating circuit further comprises:
first enable transistor operable to couple the hold transistor section to a first potential of the supply voltage
based on the negative leg of the differential clock
signal;
second enable transistor operable to couple the hold
transistor section to a second potential of the supply
voltage based on the positive leg of the differential
clock signal;
first clock skew correction module operably coupled in
series with the first enable transistor, wherein the first
clock skew correction module couples the hold transistor section to the first potential based on a second
logic function of the positive and negative legs of the
differential clock signal; and
second clock skew correction module operably coupled in
series with the second enable transistor, wherein the
second clock skew correction module couples the hold
transistor section to the second potential based on a first
logic function of the positive and negative legs of the
differential clock signal.

6. The oscillation synthesizer of claim 5, wherein the first clock skew correction module further comprises:
a P-channel transistor having a gate, a drain, and a source,
wherein the drain is coupled to the hold transistor
section, and the gate is coupled to receive a first clock
skew correction signal; and
NOR gate operably coupled to produce the first clock
skew correction signal based on the negative and
positive legs of the differential clock signal.

7. The oscillation synthesizer of claim 5, wherein the second clock skew correction module further comprises:
an N-channel transistor having a gate, a drain, and a
source, wherein the drain is coupled to the hold transistor section and the gate is coupled to receive a
second clock skew correction signal; and
NAND gate operably coupled to produce the second clock
skew correction signal based on the negative and
positive legs of the differential clock signal.

8. The oscillation synthesizer of claim 1, wherein the first gating circuit further comprises:
first enable transistor operable to couple the sample
transistor section to a first potential of the supply
voltage based on the positive leg of the differential
clock signal;
second enable transistor operable to couple the sample
transistor section to a second potential of the supply
voltage based on the negative leg of the differential
clock signal;
first clock skew correction module operably coupled in
series with the first enable transistor, wherein the first
clock skew correction module couples the sample transistor section to the first potential based on a second
logic function of the positive and negative legs of the
differential clock signal; and second clock skew correction module operably coupled in series with the second enable transistor, wherein the second clock skew correction module couples the sample transistor section to the second potential based on a first logic function of the positive and negative legs of the differential clock signal.

9. The oscillation synthesizer of claim 8, wherein the first clock skew correction module further comprises:
a P-channel transistor having a gate, a drain, and a source, wherein the drain is coupled to the hold transistor section, and the gate is coupled to receive a first clock skew correction signal; and
NOR gate operably coupled to produce the first clock skew correction signal based on the negative and positive legs of the differential clock signal.

10. The oscillation synthesizer of claim 8, wherein the second clock skew correction module further comprises:
an N-channel transistor having a gate, a drain, and a source, wherein the drain is coupled to the hold transistor section and the gate is coupled to receive a second clock skew correction signal; and
NAND gate operably coupled to produce the second clock skew correction signal based on the negative and positive legs of the differential clock signal.

11. The oscillation synthesizer of claim 1, wherein the second gating circuit further comprises:
first enable transistor operable to couple the hold transistor section to a first potential of the supply voltage based on the negative leg of the differential clock signal;
second enable transistor operable to couple the hold transistor section to a second potential of the supply voltage based on the positive leg of the differential clock signal;
first clock skew correction module operably coupled in parallel with the first enable transistor, wherein the first clock skew correction module couples the hold transistor section to the first potential based on a first logic function of the positive and negative legs of the differential clock signal; and
second clock skew correction module operably coupled in parallel with the second enable transistor, wherein the second clock skew correction module couples the hold transistor section to the second potential based on a second logic function of the positive and negative legs of the differential clock signal.

12. The oscillation synthesizer of claim 11, wherein the first clock skew correction module further comprises:
a P-channel transistor having a gate, a drain, and a source, wherein the source is coupled to the first potential, the drain is coupled to the hold transistor section, and the gate is coupled to receive a first clock skew correction signal; and
NAND gate operably coupled to produce the first clock skew correction signal based on the negative and positive legs of the differential clock signal.

13. The oscillation synthesizer of claim 11, wherein the second clock skew correction module further comprises:
an N-channel transistor having a gate, a drain, and a source, wherein the source is coupled to the second potential, the drain is coupled to the hold transistor section, and the gate is coupled to receive a second clock skew correction signal; and
NOR gate operably coupled to produce the second clock skew correction signal based on the negative and positive legs of the differential clock signal.

14. An integrated circuit radio comprises:
a transmitter section operably coupled to convert outbound data into outbound radio frequency (RF) signals based on a transmitter local oscillation;
a receiver section operably coupled to convert inbound RF signals into inbound data based on a receiver local oscillation;
local oscillation module operably coupled to produce the transmitter and receiver local oscillations, wherein the local oscillation module includes:
phase and frequency detector operably coupled to generate a charge up signal when phase of a reference oscillation leads phase of a feedback oscillation or when frequency of the reference oscillation leads frequency of the feedback oscillation, to generate a charge down signal when the phase of the reference oscillation lags the phase of the feedback oscillation or when the frequency of the reference oscillation lags the frequency of the feedback oscillation;
charge pump operably coupled to produce a positive current in response to the charge up signal and to produce a negative current in response to the charge down signal;
loop filter operably coupled to generate a control voltage based on the positive current and negative current;
voltage controlled oscillator operably coupled to generate an output oscillation based on the control voltage, wherein the transmitter and receiver local oscillations are based on the output oscillation; and
divider module operably coupled to produce the feedback oscillation from the output oscillation based on a divider value, wherein the divider module includes:
plurality of flip-flops interoperably coupled to produce the divider value based on a control signal; and
logic circuit operably coupled to produce the control signal based on divider select signals, wherein each of the plurality of flip-flops includes:
first differential latch module operably coupled to produce a differential latched signal based on a differential flip-flop input signal; and
second differential latch module operably coupled to produce a differential flip-flop output based on the differential latched signal, wherein the first and second differential latch modules each includes:
sample transistor section operably coupled to sample, when coupled to a supply voltage, a differential input signal to produce a sampled differential input signal;
hold transistor section operably coupled to latch, when coupled to the supply voltage, the sampled differential input signal thereby producing a latched differential signal;
first gating circuit operable to couple the sample transistor section to the supply voltage in accordance with a first clocking logic operation and a second clocking logic operation, wherein the first clocking logic operation is based on a negative leg and a positive leg of a differential clock signal, and wherein the second clocking logic operation is based on the negative leg and the positive leg of the differential clock signal; and
second gating circuit operable to couple the hold transistor section to the supply voltage in accordance with a third clocking logic operation and a fourth clocking logic operation, wherein the third clocking logic operation is based on the negative leg and the positive leg of the differential clock signal, and wherein the fourth clocking logic operation is based on the negative leg and the positive leg of the differential clock signal.

15. The integrated circuit radio of claim 14, wherein the first gating circuit further comprises:

first enable transistor operable to couple the sample transistor section to a first potential of the supply voltage based on the positive leg of the differential clock signal;

second enable transistor operable to couple the sample transistor section to a second potential of the supply voltage based on the negative leg of the differential clock signal;

first clock skew correction module operably coupled in parallel with the first enable transistor, wherein the first clock skew correction module couples the sample transistor section to the first potential based on a first logic function of the positive and negative legs of the differential clock signal; and second clock skew correction module operably coupled in parallel with the second enable transistor, wherein the second clock skew correction module couples the sample transistor section to the second potential based on a second logic function of the positive and negative legs of the differential clock signal.

16. The integrated circuit radio of claim 15, wherein the first clock skew correction module further comprises:

a P-channel transistor having a gate, a drain, and a source, wherein the source is coupled to the first potential, the drain is coupled to the sample transistor section, and the gate is coupled to receive a first clock skew correction signal; and NAND gate operably coupled to produce the first clock skew correction signal based on the negative and positive legs of the differential clock signal.

17. The integrated circuit radio of claim 15, wherein the second clock skew correction module further comprises:

an N-channel transistor having a gate, a drain, and a source, wherein the source is coupled to the second potential, the drain is coupled to the sample transistor section, and the gate is coupled to receive a second clock skew correction signal; and NOR gate operably coupled to produce the second clock skew correction signal based on the negative and positive legs of the differential clock signal.

18. The integrated circuit radio of claim 14, wherein the second gating circuit further comprises:

first enable transistor operable to couple the hold transistor section to a first potential of the supply voltage based on the negative leg of the differential clock signal;

second enable transistor operable to couple the hold transistor section to a second potential of the supply voltage based on the positive leg of the differential clock signal;

first clock skew correction module operably coupled in series with the first enable transistor, wherein the first clock skew correction module couples the hold transistor section to the first potential based on a second logic function of the positive and negative legs of the differential clock signal; and second clock skew correction module operably coupled in series with the second enable transistor, wherein the second clock skew correction module couples the hold transistor section to the second potential based on a first logic function of the positive and negative legs of the differential clock signal.

19. The integrated circuit radio of claim 18, wherein the first clock skew correction module further comprises:

a P-channel transistor having a gate, a drain, and a source, wherein the drain is coupled to the hold transistor section, and the gate is coupled to receive a first clock skew correction signal; and NOR gate operably coupled to produce the first clock skew correction signal based on the negative and positive legs of the differential clock signal.

20. The integrated circuit radio of claim 18, wherein the second clock skew correction module further comprises:

an N-channel transistor having a gate, a drain, and a source, wherein the drain is coupled to the hold transistor section and the gate is coupled to receive a second clock skew correction signal; and NAND gate operably coupled to produce the second clock skew correction signal based on the negative and positive legs of the differential clock signal.

21. The integrated circuit radio of claim 14, wherein the first gating circuit further comprises:

first enable transistor operable to couple the sample transistor section to a first potential of the supply voltage based on the positive leg of the differential clock signal;

second enable transistor operable to couple the sample transistor section to a second potential of the supply voltage based on the negative leg of the differential clock signal;

first clock skew correction module operably coupled in series with the first enable transistor, wherein the first clock skew correction module couples the sample transistor section to the first potential based on a second logic function of the positive and negative legs of the differential clock signal; and second clock skew correction module operably coupled in series with the second enable transistor, wherein the second clock skew correction module couples the sample transistor section to the second potential based on a first logic function of the positive and negative legs of the differential clock signal.

22. The integrated circuit radio of claim 21, wherein the first clock skew correction module further comprises:

a P-channel transistor having a gate, a drain, and a source, wherein the drain is coupled to the hold transistor section, and the gate is coupled to receive a first clock skew correction signal; and NOR gate operably coupled to produce the first clock skew correction signal based on the negative and positive legs of the differential clock signal.

23. The integrated circuit radio of claim 21, wherein the second clock skew correction module further comprises:

an N-channel transistor having a gate, a drain, and a source, wherein the drain is coupled to the hold transistor section and the gate is coupled to receive a second clock skew correction signal; and NAND gate operably coupled to produce the second clock skew correction signal based on the negative and positive legs of the differential clock signal.

24. The integrated circuit radio of claim 14, wherein the second gating circuit further comprises:

first enable transistor operable to couple the hold transistor section to a first potential of the supply voltage based on the negative leg of the differential clock signal;

second enable transistor operable to couple the hold transistor section to a second potential of the supply voltage based on the positive leg of the differential clock signal;

first clock skew correction module operably coupled in parallel with the first enable transistor, wherein the first clock skew correction module couples the hold transistor section to the first potential based on a first logic function of the positive and negative legs of the differential clock signal; and second clock skew correction module operably coupled in parallel with the second enable transistor, wherein the second clock skew correction module couples the hold transistor section to the second potential based on a second logic function of the positive and negative legs of the differential clock signal.

25. The integrated circuit radio of claim 24, wherein the first clock skew correction module further comprises:

a P-channel transistor having a gate, a drain, and a source, wherein the source is coupled to the first potential, the drain is coupled to the hold transistor section, and the gate is coupled to receive a first clock skew correction signal; and NAND gate operably coupled to produce the first clock skew correction signal based on the negative and positive legs of the differential clock signal.

26. The integrated circuit radio of claim 24, wherein the second clock skew correction module further comprises:

an N-channel transistor having a gate, a drain, and a source, wherein the source is coupled to the second potential, the drain is coupled to the hold transistor section, and the gate is coupled to receive a second clock skew correction signal; and NOR gate operably coupled to produce the second clock skew correction signal based on the negative and positive legs of the differential clock signal.

* * * * *